(12) United States Patent
Winderl

(10) Patent No.: US 6,894,378 B2
(45) Date of Patent: May 17, 2005

(54) ELECTRONIC COMPONENT WITH STACKED SEMICONDUCTOR CHIPS

(75) Inventor: Johann Winderl, Wackersdorf (DE)

(73) Assignee: Infineon Technologies AG, Munich (DE)

( * ) Notice: Subject to any disclaimer, the term of this patent is extended or adjusted under 35 U.S.C. 154(b) by 68 days.

(21) Appl. No.: 10/090,289

(22) Filed: Mar. 4, 2002

(65) Prior Publication Data

US 2002/0121687 A1 Sep. 5, 2002

(30) Foreign Application Priority Data

Mar. 2, 2001 (DE) .......................................... 101 10 203

(51) Int. Cl.⁷ .............................................. H01L 23/02
(52) U.S. Cl. ....................... 257/686; 257/774; 257/737; 257/738; 257/779; 257/780
(58) Field of Search ................................. 257/686, 774, 257/737–738, 779–780

(56) References Cited

U.S. PATENT DOCUMENTS

| | | | |
|---|---|---|---|
| 5,222,014 A | | 6/1993 | Lin |
| 5,608,265 A | | 3/1997 | Kitano et al. |
| 5,682,062 A | | 10/1997 | Gaul |
| 5,763,939 A | * | 6/1998 | Yamashita .................. 257/668 |
| 5,861,666 A | | 1/1999 | Bellaar |
| 6,180,881 B1 | * | 1/2001 | Isaak .......................... 174/52.4 |
| 6,188,127 B1 | * | 2/2001 | Senba et al. ................. 257/686 |
| 6,335,565 B1 | * | 1/2002 | Miyamoto et al. ........... 257/686 |
| 6,448,506 B1 | * | 9/2002 | Glenn et al. ................. 174/260 |
| 6,472,734 B2 | * | 10/2002 | Arakawa et al. ............. 257/686 |

FOREIGN PATENT DOCUMENTS

JP          04 030 561 A         2/1992

* cited by examiner

Primary Examiner—Luan Thai
(74) Attorney, Agent, or Firm—Laurence A. Greenberg; Werner H. Stemer; Gregory L. Mayback

(57) ABSTRACT

An electronic component with at least two stacked semiconductor chips is described. The chips are respectively mounted on a wiring board. The wiring boards are stacked one on top of the other and interconnected mechanically and electrically by soldered connections. The soldered connections extend through apertures in the wiring boards and over one or more levels of wiring boards stacked one on top of the other, with semiconductor chips mounted on these boards. A method for producing the electronic component is also described.

21 Claims, 2 Drawing Sheets

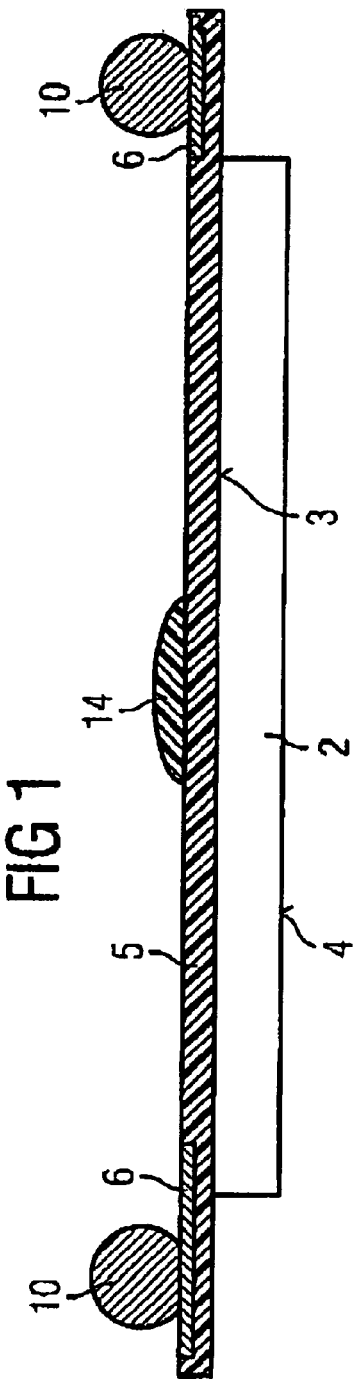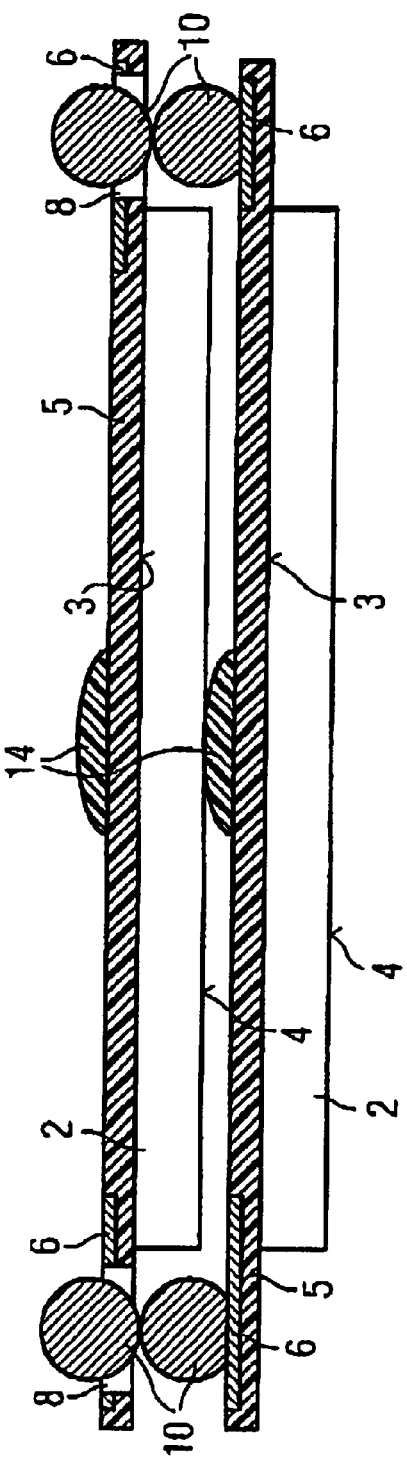

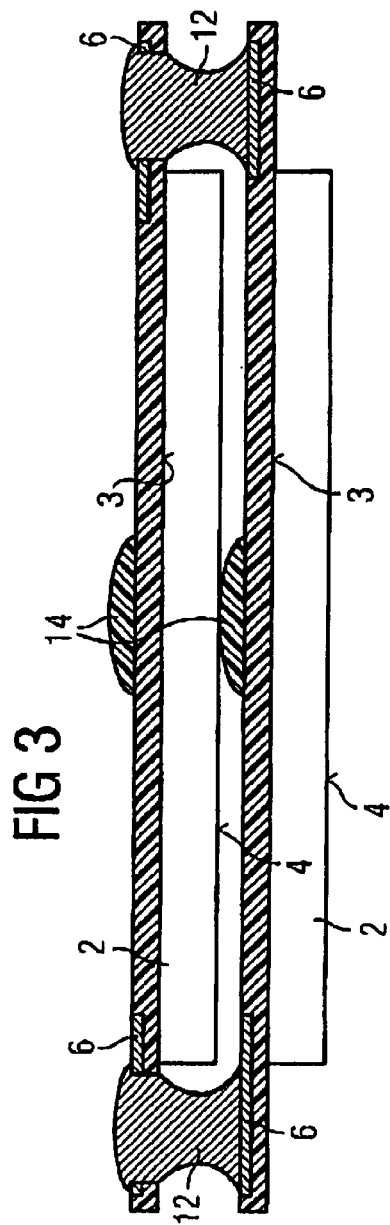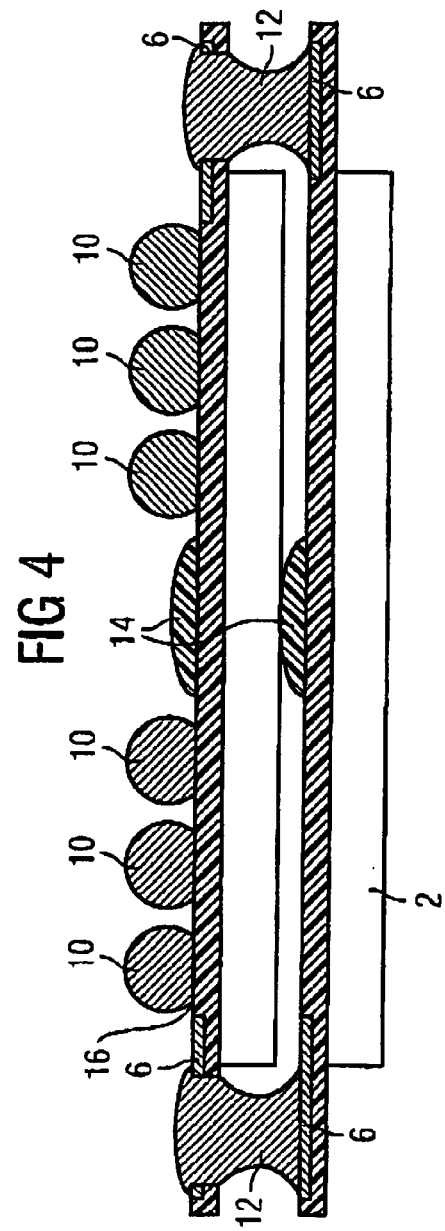

ELECTRONIC COMPONENT WITH STACKED SEMICONDUCTOR CHIPS

BACKGROUND OF THE INVENTION

Field of the Invention

The invention relates to an electronic component with stacked semiconductor chips and to a method for its production.

For more compact stacking or higher integration of electronic components, and in particular integrated semiconductor components, known as semiconductor chips, they can be stacked in a number of layers. In this case, both individual semiconductor chips and larger units made up of semiconductor chips can be stacked before they are separated, i.e. as semiconductor wafers, as they are known. To interconnect the semiconductor chips or wafers disposed one on top of the other electrically and mechanically at their contacts, they are soldered. For this purpose, apertures can be etched into the wafer by an etching process. The inner surfaces of the apertures are subsequently metallized. In this way, a number of wafers can be mechanically and electrically connected by a soldered joint, and in this way stacked one on top of the other.

For producing stacked three-dimensional topographies of semiconductor chips, known as chip-size packages (CSP), wafers are divided along separating joints between the individual semiconductor chips by an etching process, in order after that to establish wiring links from the respective active sides of the semiconductor chips to their rear sides with the contact connections and bonding areas to be soldered that are located on these sides.

SUMMARY OF THE INVENTION

It is accordingly an object of the invention to provide an electronic component with stacked semiconductor chips which overcomes the above-mentioned disadvantages of the prior art devices of this general type, which has stable mechanical and electrical connections between the semiconductor chips to be stacked, along with a minimal spatial extent.

With the foregoing and other objects in view there is provided, in accordance with the invention, an electronic component. The component contains at least two wiring boards, and at least one of the wiring boards has apertures formed therein. A semiconductor chip is mounted on each of the wiring boards and electrically connected to the respective wiring board. Solder connections are provided. The wiring boards are stacked one on top of another substantially parallel to one another and interconnected mechanically and electrically by the soldered connections resulting in at least two stacked wiring boards. The soldered connections extend through the apertures in at least one of the wiring boards and over one or more levels of the stacked wiring boards.

According to the invention, the electronic component has at least two-stacked semiconductor chips, which are respectively mounted on a wiring board and electrically connected to the latter. The at least two wiring boards are stacked one on top of the other substantially parallel to one another and interconnected mechanically and electrically by soldered connections. The soldered connections extend through apertures in at least one of the wiring boards and over one or more levels of wiring boards stacked one on top of the other, with semiconductor chips mounted on the boards.

The electronic component according to the invention has the advantage that three-dimensionally structured components can be produced from stacked semiconductor chips in a simple and exact way. The components can be made very compact and have great mechanical stability.

In one embodiment of the invention, the soldered connections are provided in edge regions of the at least two stacked wiring boards. This embodiment has the advantage that the soldered connections act as load-bearing mechanical connections and at the same time can provide the electrical connection of the semiconductor chips to one another.

A further embodiment provides that the soldered connections are respectively formed by solder balls lying one on top of the other and fused together. In this embodiment, it is of advantage that an exactly defined position of the wiring boards with the semiconductor chips mounted on them is made possible in an easy way in terms of production engineering. The subsequently fused together solder balls provide an electrically and mechanically good connection.

In a further embodiment of the invention, it is provided that the solder balls to be fused have a smaller diameter than the apertures in the wiring boards. This embodiment has the advantage that, by simply putting solder balls in place, wiring boards can be stacked one on top of the other and the solder balls fused while maintaining the distance predetermined by a plastic buffer, such as for example a bonding channel covering.

A further embodiment according to the invention provides that the at least two wiring boards with the semiconductor chips mounted on them are stacked one on top of the other in such a way that a rear side of one semiconductor chip is facing an underside of a neighboring wiring board. This embodiment has the advantage that minimal distances between the individual stacking levels can be realized in this way.

A further embodiment of the invention provides that the undersides of the wiring boards are provided with supporting points, on which a rear side of a semiconductor chip respectively comes to bear. What is especially advantageous about this embodiment is that the supporting points represent a defined bearing point for the successively following wiring boards of the stack. Even if there are slight differences in the diameter of the solder balls and/or of the apertures in which they come to lie, there is no risk of any direct contact between the wiring board and the semiconductor chip of different stacking levels.

In a further embodiment according to the invention, the supporting points take the form of plastic buffers disposed centrally on the rear sides of the wiring boards, which has the advantage of an insulating effect in mechanical, electrical and thermal respects.

In a further embodiment according to the invention, the plastic buffers are formed of an elastomer, which has in particular the advantage of effective mechanical damping between the surfaces in contact with them.

A further embodiment of the invention provides that an uppermost and/or undermost wiring board of a stack is provided with near-edge electrical contacts without apertures. This embodiment has the advantage that the liquefied solder of the fused solder ball is kept on the contact area and cannot flow away toward a side on which no further wiring board is attached.

A further embodiment of the invention provides that an undermost wiring board of a stack is provided with contact terminal areas, accompanied by the advantage that the wiring board can be directly bonded with further electric circuits.

A further embodiment of the invention provides that an undermost wiring board of a stack is provided with contact bumps, accompanied by the advantage that the wiring board can be directly mounted and electrically bonded on a printed circuit board or the like.

A further embodiment of the invention provides that an undermost wiring board of a stack is provided with solder deposits located on the contact terminal areas. This embodiment has the advantage that the undermost wiring board can be connected to further electric circuits in a simple way by melting these solder deposits.

A further embodiment of the invention provides that the wiring boards which are not the undermost or uppermost of a stack are provided with near-edge electrical contacts with apertures, which has the advantage that the solder balls coming to bear in the apertures provide an exact distance of the wiring boards from one another in the stacked state. In the molten state, the apertures provide the special advantage of a soldered connection that extends over a number of levels of the stack and is consequently mechanically very stable.

A further embodiment of the invention provides that the wiring boards which are not the undermost or uppermost of a stack are provided with near-edge electrical contacts without apertures. This is accompanied by the advantage of different electrical bonding of the contact points from both sides, since no plating through takes place.

In a method for producing an electronic component which has at least two stacked semiconductor chips which are respectively mounted on a wiring board and electrically connected to the latter, it is provided that the at least two wiring boards are stacked one on top of the other essentially parallel to one another and interconnected mechanically and electrically by soldered connections. Moreover, the soldered connections extend through apertures in at least one of the wiring boards and over one or more levels of wiring boards stacked one on top of the other with semiconductor chips mounted on them. According to the invention, the method contains the following method steps. After preparing wiring boards with semiconductor chips mounted on them and electrically connected to them, supporting points are applied to the rear sides of the wiring boards facing away from the semiconductor chips. After that, solder is provided in near-edge apertures of the wiring boards, with electrical contacts adjoining the apertures. Parallel stacking of at least two wiring boards with semiconductor chips mounted on them subsequently takes place, a passive rear side of a semiconductor chip respectively coming to bear on a supporting point. Finally, the solder is melted, whereby mechanical and electrical connections are established between the adjoining levels of the stack.

This method has the advantage that very compact and highly integrated electronic components with semiconductor chips can be produced in this way. Moreover, the method has the advantage that a high level of precision is obtained in production, i.e. the geometrical dimensions and positions of the parts to be connected to one another can be maintained very exactly with the method according to the invention. With the aid of the method according to the invention, the stacking of a large number of individual assemblies containing wiring boards and semiconductor chips mounted on them is possible.

In a first exemplary embodiment of the method, the solder is provided in the apertures in the form of solder balls that have a smaller diameter than the apertures. This exemplary embodiment has the advantage of an optimally defined position of the stacked wiring boards in relation to one another. On the basis of the predetermined geometrical dimensions of the apertures, solder balls and the distance between the wiring boards stacked one on top of the other, they can be fixed and connected approximately in parallel and at a defined distance in relation to one another with minimal tolerance.

In a further exemplary embodiment of the method, the solder is provided in the apertures in the form of solder paste. This further exemplary embodiment has the advantage that the solder paste adheres very well on the metallic contact terminal areas, even under unfavorable conditions, allowing the risk of a defectively soldered connecting point to be minimized.

For a further exemplary embodiment of the method, it is provided that the wiring boards are mechanically fixed during the stacking and before the soldering, which has the advantage of a very low defect or reject rate in the production of the stacked electronic components. Moreover, in this way, handling of the individual parts to be processed and connected is also possible in any desired position.

An alternative example of how the method is carried out provides that a number of semiconductor wafers are stacked one on top of the other and, and after connecting the contact vias with the conductor tracks of semiconductor wafers lying above or below, the stacked semiconductor wafers are individually separated into stacked semiconductor chips.

This example of how the method is carried out has the advantage that a very efficient way of processing relatively large batches is made possible. The forming of stacked assemblies on the wafer level can make it possible for the production equipment to achieve a higher throughput.

A further exemplary embodiment of the method according to the invention provides that, for melting the soldered joints for connecting the stacked wiring boards, the latter are heated to a soldering temperature, which has the advantage of a very quick and reliable connection, and consequently very quick and efficient processability.

To sum up, the following aspects of the invention are obtained. The electronic component according to the invention may contain a number of stacked assemblies which are respectively formed by a wiring board, known as the substrate carrier (also referred to as an interposer), and a semiconductor chip fastened on it with positive engagement. The wiring of the contact terminals of the semiconductor chip, some of which are microscopic, to form larger contact terminal areas suitable for further processing takes place on the wiring board. This mentioned assembly is also referred to as a CSP (chip-size package). Provided at the edge of the wiring board are contact terminal areas, known as landing pads, on which solder balls are provided. In a subsequent production step, the solder balls are melted and provide an electrical and mechanical connection to further wiring boards, or else for mounting on a printed circuit board or the like.

The individual assemblies—containing wiring boards and semiconductor chips—are interconnected both mechanically and electrically by the solder balls. What is important here is that the respective connecting points are disposed vertically one above the other and that the respective contact terminal area (landing pad) has a sufficiently large opening, so that a solder ball placed on top of it can contact a solder ball lying under it. During the soldering, known as the reflow process, the solder balls become molten and fuse together. Once the solder has solidified, connections of one wiring board to the respectively adjoining wiring board consequently form. As an option instead of the solder balls described, it is also possible to use solder paste, which is applied to the respective connecting point by what is known as a dispensing device. In this case, no openings or apertures are required in the contact terminal areas at the outer edge of the wiring boards.

Other features which are considered as characteristic for the invention are set forth in the appended claims.

Although the invention is illustrated and described herein as embodied in an electronic component with stacked semiconductor chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view of a wiring board with a semiconductor chip mounted on it, before stacking, and according to the invention;

FIG. 2 is a sectional view of two wiring boards stacked one on top of the other, corresponding to FIG. 1;

FIG. 3 is a sectional view of the two wiring boards stacked one on top of the other and securely connected to each other; and FIG. 4 is a sectional view of the two wiring boards stacked one on top of the other, corresponding to FIG. 3, with solder balls having being provided on an uppermost wiring board.

DESCRIPTION OF THE PREFERRED EMBODIMENTS

In the following descriptions of the figures, exemplary embodiments of the invention are represented. The same parts are always provided with the same reference numerals in the figures and in some cases are not explained more than once.

Referring now to the figures of the drawing in detail and first, particularly, to FIG. 1 thereof, there is shown a schematic cross section of a wiring board 5 with a semiconductor chip 2 mounted on it, before being stacked with further wiring boards. The semiconductor chip 2 is mounted with its active front side 3, which has semiconductor structures, on the flat wiring board 5 with positive engagement. On the flat side of the wiring board 5 facing away from the semiconductor chip 2 there can be seen a plastic buffer 14, which is explained below with reference to FIG. 2.

At an outer edge of the wiring board 5, the wiring board 5 is provided with contacts 6, which are connected to non-illustrated conductor tracks. The conductor tracks lead to the contacts, which have electrical connections with contact terminal areas of the semiconductor chip 2. Respectively provided on the metallic contacts 6 are solder balls 10, which, after the stacking of two or more of the wiring boards 5, are melted and provide an electrical and mechanical connection of the wiring boards 5.

FIG. 2 shows a schematic cross section of two wiring boards 5 stacked one on top of the other. The plastic buffer 14 fastened centrally on each of the wiring boards 5 is in this case in contact with a passive rear side 4 of the semiconductor chip 2 mounted on the next wiring board 5. The wiring board 5 that is undermost in FIG. 2 is provided at its outer edge with the electrical contacts 6 without apertures, on which the solder balls 10 respectively rest. The further wiring board 5 resting on the undermost wiring board 5 is likewise provided at its outer edge with the electrical contacts 6, and the wiring board 5 has apertures 8. In this case, the electrical contacts 6 of the wiring boards 5 lying one on top of the other lie approximately congruently one above the other, so that the solder balls 10 located in the apertures 8 come to lie vertically one above the other.

FIG. 3 shows a schematic cross section of the two wiring boards 5 stacked one on top of the other and securely interconnected. In this case, the solder balls 10 respectively lying one above the other were melted by heating and in each case form a soldered connection 12 extending through the entire stack. Each soldered connection 12 provides a mechanical fixing of the stacked wiring boards 5 and at the same time represents an electrical connection between the electrical contacts 6 lying one above the other.

FIG. 4 shows a further schematic cross section of the two wiring boards 5 stacked one on top of the other and securely interconnected. On the uppermost wiring board 5, the solder balls 10, which can provide a secure mechanical and electrical connection on a mounting location by melting, are in this case respectively provided on contact terminal areas 16.

The contacts 6 at the edge of the wiring boards 5 may either be provided along all the edges of each wiring board or, if appropriate, be located only on two oppositely lying sides of the wiring boards 5.

An exemplary embodiment of the production method according to the invention for producing an electronic component is described below on the basis of FIGS. 1 to 4 explained above.

First, the semiconductor chips 2 with the passive rear sides 4 without integrated circuits and with the active front sides 3 with integrated circuits are prepared. The semiconductor chips 2 are in each case mechanically and electrically connected with positive engagement to the wiring boards 5, which respectively have electrical contacts 6 on at least two oppositely lying side edges. On the surfaces of the wiring boards 5 facing away from the semiconductor chips 2, supporting points are respectively applied in an approximately central position in the form of the plastic buffers 14.

Apart from those of the undermost wiring board 5, the contacts 6 of the wiring boards 5 are respectively provided with the apertures 8, into which the solder balls 10 are placed. This is followed by at least two wiring boards 5 being stacked in parallel, so that the contacts 6 come to lie with the apertures 8 located in them and the solder balls 10 placed in the apertures 8 one above the other. The passive rear sides 4 of the semiconductor chips 2 in this case come to bear respectively on the plastic buffer 14 of an adjoining wiring board 5. By heating the stack, the solder balls 10 are fused to form the continuous soldered connections 12, which provide a mechanical connection of the stack and an electrical connection of the contacts 6 to one another.

The electronic component according to the invention may be formed by a multiplicity of semiconductor chips 2 mounted on the wiring boards 5 and stacked one on top of the other. The stacked wiring boards do not necessarily have to be of the same dimensions. All that is important is that, when there are two wiring boards 5 lying one on top of the other, at least two or more of the contacts 6 with the apertures 8 and the solder balls 10 placed in them come to lie congruently one above the other. The soldered connections extending over the stack do not have to be continuous soldered connections from the lowermost to the uppermost wiring board 5. Similarly possible are soldered connections that are continuous over certain sections, which in each case connect two or more of the wiring boards 5. In this way, electronic components can be formed from any desired stacks of wiring boards of different sizes with semiconductor chips of different sizes mounted on them.

I claim:

1. An electronic component, comprising:

at least two wiring boards stacked on top of one another and substantially parallel to one another, at least one of said at least two wiring boards having apertures formed therein, said stacked wiring boards including an uppermost wiring board and an undermost wiring board, at least one of said uppermost wiring board and said undermost wiring board having near-edge electrical contacts without said apertures;

at least two semiconductor chips each mounted on a respective wiring board of said at least two wiring boards and electrically connected to said respective wiring board; and solder connections mechanically and electrically interconnecting said at least two stacked wiring boards, said soldered connections extending through said apertures in at least one of said at least two stacked wiring boards and over one or more levels of said at least two stacked wiring boards.

2. The electronic component according to claim 1, wherein said stacked wiring boards have edge regions and said soldered connections are provided in said edge regions.

3. The electronic component according to claim 1, wherein said soldered connections are respectively formed by solder balls lying one on top of another and fused together.

4. The electronic component according to claim 3, wherein said solder balls have a smaller diameter than said apertures.

5. The electronic component according to claim 1, wherein said wiring boards with said semiconductor chips mounted on them are stacked one on top of another in such a way that a rear side of one of said semiconductor chips faces an underside of a neighboring one of said wiring boards.

6. The electronic component according to claim 1, wherein said wiring boards have undersides with supporting points, and a respective semiconductor chip of said semiconductor chips has a rear side bearing on one of said undersides.

7. The electronic component according to claim 6, wherein said supporting points are plastic buffers disposed centrally on said undersides of said wiring boards.

8. The electronic component according to claim 7, wherein said plastic buffers contain an elastomer.

9. The electronic component according to claim 1, wherein said undermost wiring board has contact terminal areas.

10. The electronic component according to claim 9, wherein said undermost wiring board has solder deposits located on said contact terminal areas.

11. The electronic component according to claim 1, wherein said undermost wiring board has contact bumps.

12. The electronic component according to claim 1, wherein said wiring boards which are not said undermost wiring board or said uppermost wiring board have near-edge electrical contacts with said apertures.

13. The electronic component according to claim 1, wherein said wiring boards which are not said undermost wiring board or said uppermost wiring board have near-edge electrical contacts without said apertures.

14. A method for producing an electronic component, which comprises the steps of:

providing at least two stacked wiring boards having apertures formed therein, the stacked wiring boards including an uppermost wiring board and an undermost wiring board, at least one of the uppermost wiring board and the undermost wiring board having near-edge electrical contacts without the apertures;

mounting at least two semiconductor chips on each respective wiring board of the at least two wiring boards and electrically connecting to the respective wiring boards;

depositing solder in the apertures of the wiring boards;

stacking the wiring boards on top of one another and substantially in parallel; and melting the solder resulting in solder connections mechanically and electrically interconnecting the at least two stacked wiring boards, the solder connections extending through the apertures in at least one of the at least two stacked wiring boards and over one or more levels of the at least two stacked wiring boards.

15. The method according to claim 14, which comprises providing the solder in the apertures in a form of solder balls having a smaller diameter than the apertures.

16. The method according to claim 14, which comprises providing the solder in the apertures in a form of solder paste.

17. The method according to claim 14, which comprises fixing mechanically the wiring boards during the stacking step and before the melting step.

18. The method according to claim 14, which comprises forming the semiconductor chips by the further steps of:

stacking a number of semiconductor wafers one on top of another;

connecting contact vias with conductor tracks of the semiconductor wafers lying above or below; and separating the semiconductor wafers into stacked semiconductor chips.

19. The method according to claim 14, which comprises heating the solder to a soldering temperature for connecting the wiring boards.

20. The method according to claim 14, wherein the apertures are provided near an edge of the at least two wiring boards.

21. The method according to claim 14, further comprising applying supporting points to rear sides of the at least two wiring boards facing away from the semiconductor chips.

* * * * *